United States Patent [19]

Watanabe et al.

[11] 3,967,143

[45] June 29, 1976

[54] ULTRASONIC WAVE GENERATOR

[75] Inventors: Akinori Watanabe; Katsuhide Tanoshima; Takao Ando; Akira Tohama; Akio Nagano, all of Tokyo, Japan

[73] Assignee: Oki Electric Industry Company, Ltd., Tokyo, Japan

[22] Filed: Oct. 10, 1974

[21] Appl. No.: 513,752

[52] U.S. Cl. .................................. 310/8.1; 318/116; 331/116 R

[51] Int. Cl.² ......................................... H01L 41/04

[58] Field of Search .................. 310/8.1; 331/116 R; 318/116, 118

[56] References Cited

UNITED STATES PATENTS

| | | | |
|---|---|---|---|
| 3,293,456 | 12/1966 | Shoh | 318/116 X |
| 3,296,511 | 1/1967 | Van Der Burgt et al. | 318/116 |
| 3,447,051 | 5/1969 | Attwood et al. | 310/8.1 X |
| 3,629,726 | 12/1971 | Popescue | 310/8.1 X |
| 3,668,486 | 6/1972 | Silver | 310/8.1 X |
| 3,809,977 | 5/1974 | Balamuth | 310/8.1 X |
| 3,813,616 | 5/1974 | Antonevich | 310/8.1 X |
| 3,819,961 | 6/1974 | Prudent et al. | 310/8.1 |
| 3,842,340 | 10/1974 | Brandquist | 310/8.1 X |

*Primary Examiner*—Mark O. Budd
*Attorney, Agent, or Firm*—Kenyon & Kenyon

[57] ABSTRACT

The ultrasonic wave generator of the present invention always drives a transducer with the resonant frequency $f_o$ of the transducer. Although the resonant frequency $f_o$ changes due to the temperature change etc., the driving frequency automatically follows the change of the resonant frequency $f_o$. The control of the driving frequency is performed by means of a feed-back loop including a voltage controlled oscillator and means for applying a control signal to said voltage controlled oscillator according to the amplitude and/or phase of the driving signal of the transducer.

4 Claims, 12 Drawing Figures

ULTRASONIC WAVE GENERATOR

BACKGROUND OF THE INVENTION

The present invention relates to an ultrasonic wave generator, and in particular relates to the same according to the principle of the piezo electric oscillation.

Recently ultrasonic wave generators have been variously utilized in fields including sonar fish detection apparatuses, moisture suppliers, ink mist type printers, etc. Ink mist type printing is one of the most important fields to which the present invention may be applied. The ink mist type printer operates on the principle that an ion stream modulated by an aperture board according to the pattern of the character to be printed, charges the ink mist, which is then attracted by an electric field to the surface of the paper. The ink mist type printer has many advantages, among which are that any character, including even Chinese characters, can be printed, the printing speed is very high, and the process is noiseless. The present applicants have already filed some patent applications concerning the ink mist type printer, one of which being U.S. Ser. No. 492,340. In the ink mist type printer, an ink mist is generated as the result of an ultrasonic wave energy being applied to the ink. In order to obtain clearly printed characters, the density of the ink mist should be as high as possible, preferably almost at saturation point. To attain sufficient power or energy of the ultrasonic wave to meet this end an improved effective ultrasonic wave generator with low power loss is required.

A prior ultrasonic wave generator comprises an oscillator, a power amplifier for amplifying the output of the oscillator, and a piezo-electric transducer connected to the output of the power amplifier for generating ultrasonic wave energy. However, the resonant frequency of the transducer depends upon the quality of the raw material, the cutting accuracy, the mounting means and/or the change of the temperature. Further, the output frequency of the oscillator is affected by errors in circuit parts and/or the change of the temperature. Accordingly, in many cases the transducer does not match the oscillator, and therefore can not provide the maximum power of the ultrasonic wave.

As apparent from the above explanation, disadvantages of prior ultrasonic wave generators include the reduction of power of the ultrasonic wave due to mismatching of the transducer and the oscillator.

SUMMARY OF THE INVENTION

It is an object, therefore, of the present invention to overcome the disadvantage of prior ultrasonic wave generators by providing a new and improved ultrasonic generator.

It is also an object of the present invention to provide a new and improved method for generating an ultrasonic wave.

The above and other objects are attained by an ultrasonic wave generator having a transducer and a voltage controlled oscillator with a feed-back loop. The oscillating frequency of said voltage controlled oscillator is controlled so that said frequency follows changes of the resonant frequency of the transducer.

BRIEF DESCRIPTION OF THE DRAWINGS

The foregoing and other objects, features, and attendant advantages of the invention will be appreciated when clarified by the accompanying drawings wherein.

DETAILED DESCRIPTION OF THE PREFERRED EMBODIMENTS

Figure 1:
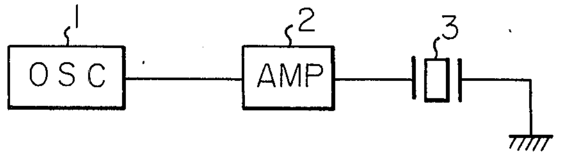
FIG. 1 is a block-diagram of a prior ultrasonic generator.

FIG. 1 shows a block-diagram of a prior ultrasonic generator, in which reference number 1 shows an oscillator of a predetermined frequency, 2 is a power amplifier and 3 is a transducer for generating ultrasonic waves. As was mentioned before, the generator of FIG. 1 is inefficient, since the frequency generated by the oscillator 1 does not always match the optimum frequency of the transducer 3.

Figure 2:
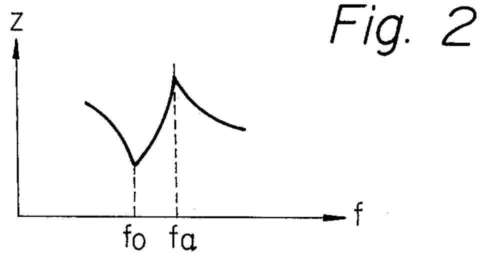
FIG. 2 is a curve between the impedance and frequency of a transducer.

FIG. 2 shows a curve between the impedance and the frequency of a transducer, in which $f_o$ is a series resonance frequency and, $f_a$ is a anti-resonance frequency. It is well known that the maximum ultrasonic wave power is obtained when the driving frequency is equal to the series resonance frequency $f_o$, and the efficiency of a transducer is maximum when the frequency is $f_o$. It is therefore desirable that the driving frequency of the transducer be equal to the series resonance frequency $f_o$.

Figure 3:
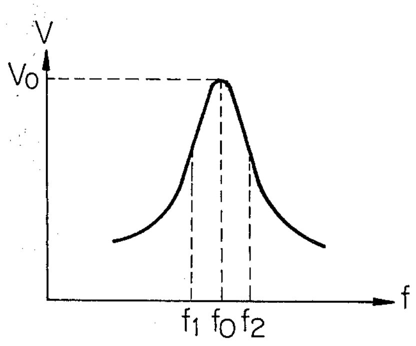
FIG. 3 is a curve of frequency characteristics of an output voltage from a detection electrode mounted in a transducer.

FIG. 3 shows the curve of frequency characteristics of an output voltage from an detection electrode mounted in a transducer. It should be understood that the output voltage is maximum $V_o$ when the frequency is equal to the series resonance frequency $f_o$.

The present invention utilizes the above characteristics of a transducer.

Figure 4:
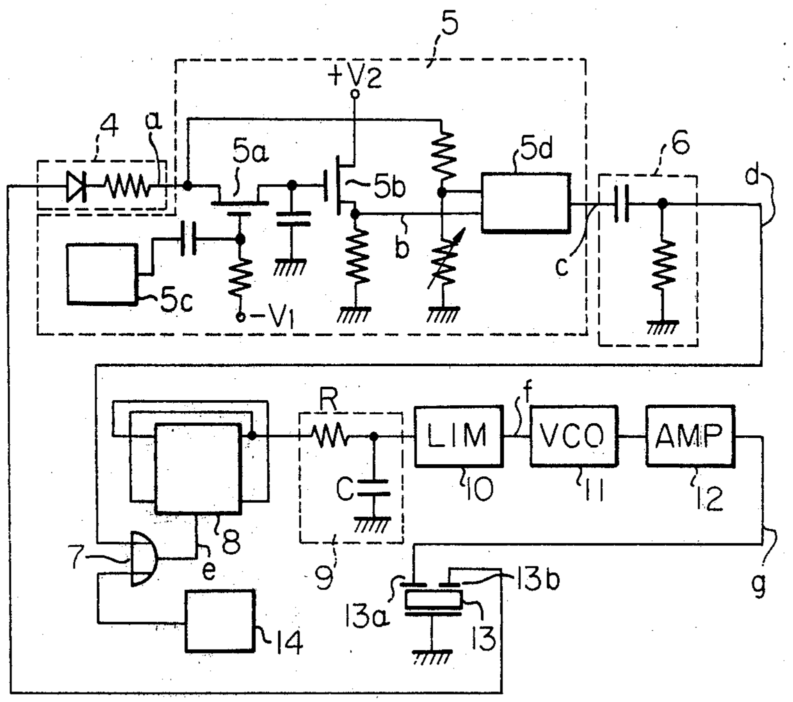
FIG. 4 is an embodiment of a circuit diagram of an ultrasonic wave generator according to the present invention.

FIG. 4 shows a block-diagram of the first embodiment of the ultrasonic wave generator according to the present invention. In FIG. 4, the reference number 4 is a rectifier, the output of which is applied to a slope detection circuit 5. The slope detection circuit 5 comprises a sample hold circuit having field-effect transistors *5a* and *5b* and their associated resistors and capacitors, an oscillator *5c* for generating a clock pulse which determines the timing of the actual sampling operation in said sample hold circuit, and a comparator *5d* for comparing the input voltage level of said sample hold circuit with the output voltage level from said sample hold circuit. The sample hold circuit holds the DC voltage level from rectifier 4 from one particular clock pulse until the succeeding clock pulse from oscillator 5*c* appears. Comparator 5*d* compares the input voltage of the sample hold circuit with the output voltage of the same, and tests whether or not the input voltage to the sample hold circuit has increased or decreased during each cycle of the clock pulse of the oscillator 5*c*. The slope detection circuit 5 provides an output signal when the input voltage to the sample hold circuit is smaller than the former one. The output signal of the slope detection circuit is applied to a differentiation circuit 6, the output signal of which triggers through OR circuit 7 a binary counter 8 and changes the output of the same from 1 to 0 or vice versa. The output signal of counter 8 is integrated by an integrator 9, the integrated output of which is applied to a voltage limiter 10. The voltage limiter 10 functions to pre-set the voltage range for frequency control. 11 is a voltage controlled oscillator which generates a high frequency proportional to the input voltage to the same. The high frequency from oscillator 11 is amplified by the power amplifier 12, the output of which is applied to a driving electrode 13*a* of transducer 13.

Figure 5:
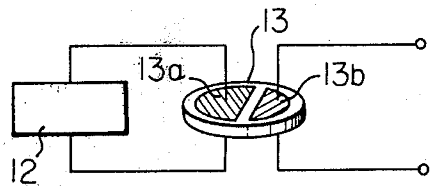
FIG. 5 is an embodiment of a structure of a transducer.

FIG. 5 shows the structure of transducer 13, which has a driving electrode 13*a* and a detection electrode 13*b*. The voltage detected by the detection 13*b* is fed back to the rectifier 4.

Figure 6:
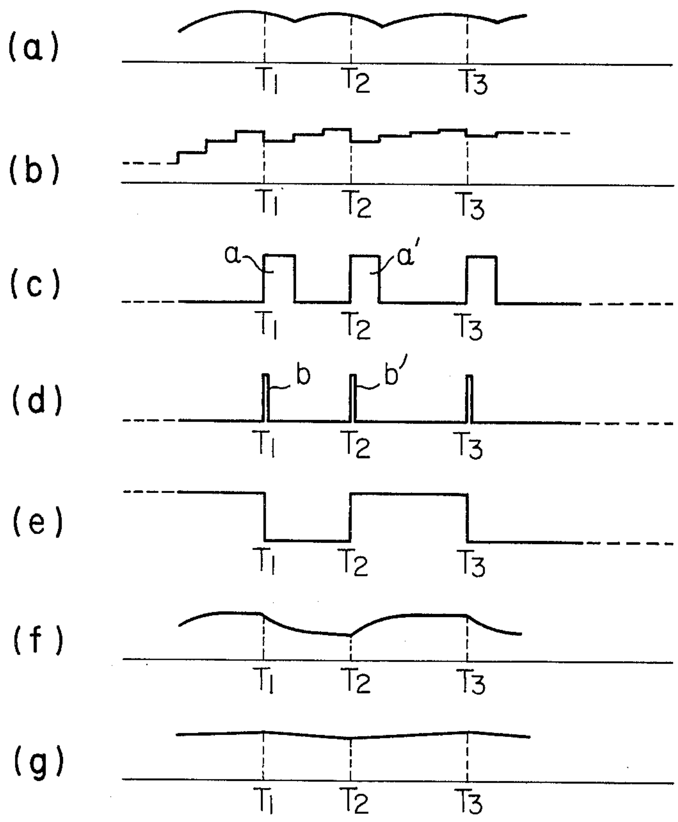
FIG. 6 shows time-charts explaining the operation of the apparatus of FIG. 4.

Now, the operation of the ultrasonic wave generator of FIG. 4 is explained with time-charts in FIG. 6. FIG. 6, a horizontal axis represents a time axis, and curve (*a*) shows an output waveform of the rectifier 4, curve (*b*) shows an output waveform of the sample hold circuit (5), curve (*c*) shows an output waveform of the comparator 5*d*, curve (*d*) shows an output waveform of the integrator or a trigger circuit 6, curve (*e*) shows an output waveform of the set terminal of the binary counter 8, curve (*f*) shows an input waveform to the voltage controlled oscillator 11, and curve (*g*) shows the value of frequency applied to the driving electrode 13*a* of transducer 13.

Assuming that the resonant frequency of transducer 13 changes at time ($T_1$) due to the atmospheric temperature, the output voltage of the detection electrode 13*b* is reduced and said output voltage is corrected by rectifier 4 as shown in FIG. 6(*a*). The sample hold circuit in the slope detection circuit 5 tests for a predetermined sampling period the output of the rectifier 4. The recorded value reduces at time $T_1$ (FIG. 6(*b*)), and accordingly, comparator 5*d* provides an output signal as shown in FIG. 6(*c*), and the differentiation circuit 6 receives signal *a* and produces a signal *b* as shown in FIG. 6(*d*). The differentiated signal *b* is applied as a trigger pulse to the binary counter 8, the output of which is inverted as shown in FIG. 6(*e*) by the differentiated signal *b*. Therefore, the output level of the integrator 9 and the input voltage to the voltage controlled oscillator 11 reduce at a rate defined by the time constant $C \times R$ after time $T_1$ (FIG. 6(*f*)). Due to the reduction of the input voltage, the output frequency of the voltage controlled oscillator 11 decreases after time $T_1$ as shown in FIG. 6(*g*). Assuming that the output frequency of the voltage controlled oscillator 11 declines. At this time the driving frequency from the power amplifier 12 approaches the resonant frequency $f_o$ of the transducer 11, if the detection voltage of the detection electrode 13*b* increases, while the driving frequency from the power amplifier 12 diverges from the resonant frequency $f_o$ of the transducer 11, if the detection voltage of the detection electrode 13*b* decreases. In the latter case, the reduction of the voltage of the detection electrode 13*b* is detected by slope detection circuit 5, comparator 5*d* produces another output signal, the content of binary counter 8 is inverted again, the output frequency of voltage controlled oscillator 11 increases, and the frequency supplied to driving electrode 13*a* comes nearer to the resonant frequency of transducer 13, while in the former case, as the driving frequency approaches the resonant frequency, the detection voltage increases. The same operation is repeated until the detection voltage reaches a maximum value.

If the detection voltage by the detection electrode 13*b* reduces again at time $T_2$, a similar operation is performed. At first, comparator 5*d* produces an output signal *a'*, and a trigger pulse *b'* from the differentiation circuit 6 inverts the content of binary counter 8. Integrator 9 produces an output voltage whose amplitude increases at a rate defined by the time constant $C \times R$. Said output voltage is applied to the voltage controlled oscillator 11 through the voltage limiter 10 and increases its output frequency. If the detection electrode 13*b* should detect a reduction in voltage at time $T_3$, an operation opposite to the above is performed and the driving frequency to transducer 13 reduced. The operation as explained above is performed every time the detection voltage decreases.

Figure 7:
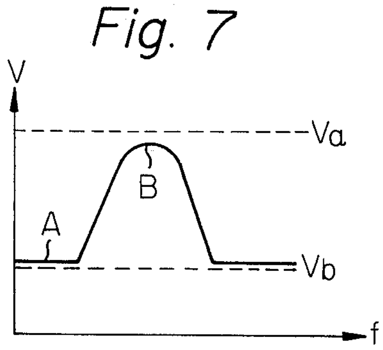
FIG. 7 is a curve of an input voltage versus output frequency of the voltage controlled oscillator in FIG. 4.

An oscillator 14 which provides the considerably lower frequency than the frequency of the trigger pulse from integrator 9 provides the automatic initialization of the apparatus when electric power is switched on. The output of oscillator 14 is applied to binary counter 8 through OR circuit 7, and binary counter 8 can be triggered by either differentiation circuit 6 or oscillator 14. FIG. 7 shows the relationship between the input voltage (vertical axis) of the voltage controlled oscillator 11 and the oscillating frequency (horizontal axis), wherein $V_a$ and $V_e$ are the maximum input voltage and the minimum input voltage, respectively. It should be noted that the status of binary counter 8 when the electric power is switched on is random, so it may occur that the point A in FIG. 7 corresponds to the reset (or 0) status of the binary counter 8 and the point B to the set (or 1) status. However, under that condition voltage controlled oscillator 11 can not oscillate at the resonant frequency $f_o$. In this case, the oscillator 14 changes the status of the binary counter 8 and enables oscillator 11 to oscillate at the resonant frequency $f_o$.

Figure 8:
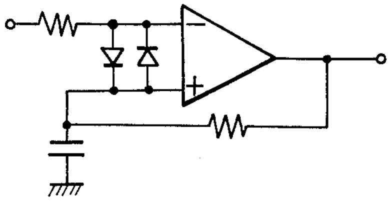
FIG. 8 is a circuit diagram of integral type comparator in FIG. 4.

Many modifications of the embodiment in FIG. 4 are possible to those skilled in the art within the spirit of the present invention. For instance, the sample hold circuit in the slope detection circuit can be replaced by an integral type comparator in FIG. 8. The integral type comparator has a large time constant.

As is apparent from the above explanation, the ultrasonic wave generator in FIG. 4 comprises a detection electrode, and the frequency applied to the transducer is controlled so as to increase the voltage detected by said detection electrode. That is to say, although the resonant frequency of the transducer changes, the frequency applied to the transducer follows changes in the resonant frequency. Accordingly, the transducer always operates highly efficiently at the set resonant frequency to provide an ultrasonic wave power.

Now, the second embodiment of the present invention will be explained in detail.

Figure 9:
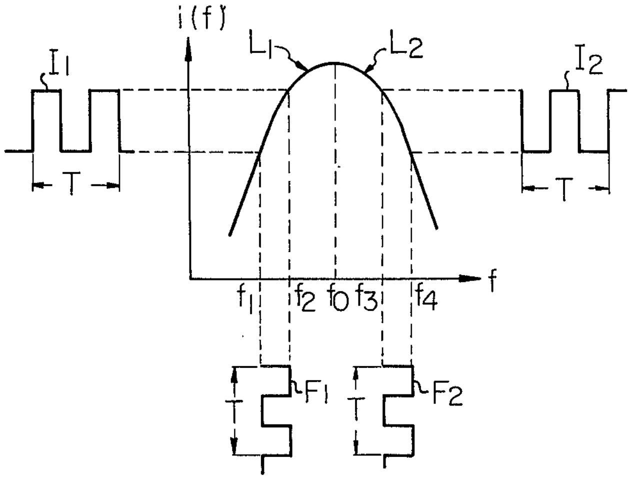
FIG. 9 is a curve between the input current and the frequency of a transducer.

FIG. 9 shows the operational principle of the second embodiment. The curve in FIG. 9 shows the relationship between the frequency (horizontal axis) applied to the transducer and the current, (vertical axis), flowng in said transducer. As is apparent from the curve, the resonant frequency $f_o$ provides the maximum current, and, in turn, the maximum power of the ultrasonic wave. In FIG. 9, when the driving frequency changes between $f_1$ and $f_2$ which are lower than $f_o$ as shown in the waveform $F_1$ during a period T, the current changes as shown in waveform $I_1$. On the other hand, when the driving frequency changes between $f_3$ and $f_4$, which are higher than $f_o$, as shown in the waveform $F_2$, the current changes as shown in waveform $I_2$. That is to say, when the driving frequency is lower than $f_o$, the increase in driving frequency increases the current, whereas on the other hand, when the driving frequency is higher than $f_o$, an increase in driving frequency decreases the current. The ultrasonic wave generator of the second embodiment operates according to the above principle.

Figure 10:
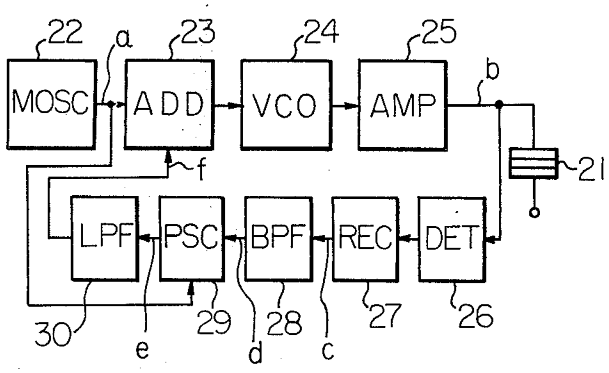
FIG. 10 is a second embodiment of an ultrasonic wave generator according to the present invention.
Figures 11A, 11B:
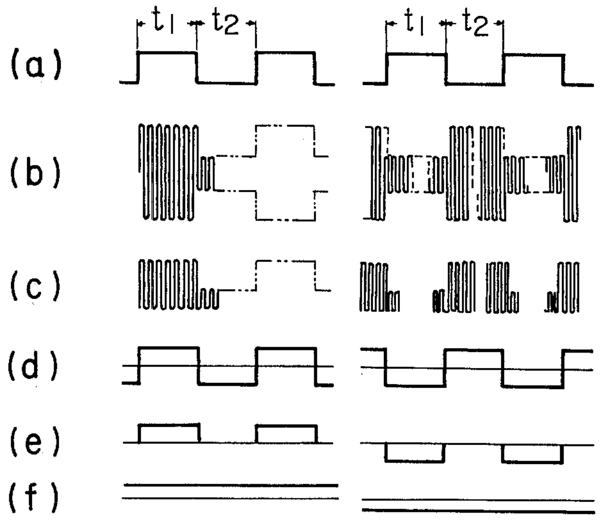
FIGS. 11A and 11B are time charts showing the operation of the apparatus of FIG. 10.

FIG. 10 shows a block-diagrams of the ultrasonic wave generator according to the second embodiment of the present invention, and FIG. 11A and FIG. 11B show the operational waveforms of the apparatus in FIG. 10. In FIG. 10, the reference number 22 is a modulation signal oscillator, 23 is an analog adder, 24 is a variable frequency oscillator, 25 is an amplifier for supplying electrical power to the transducer 21, 26 is a current detector for the detection of a value of the current flowing in the transducer 21, 27 is a rectifier, 28 is a band pass filter whose center frequency is approximately the same as that of the modulation signal by the oscillator 22, 29 is a phase selection circuit having an analog switch and/or a relay contact which functions solely to pick up the output signal of the band pass filter 28 when the output of the modulation signal oscillator 22 is positive, and 30 is a low pass filter.

Further, in FIG. 11A and FIG. 11B, a waveform (*a*) shows the output waveform of the modulation signal oscillator 22, (*b*) is a driving waveform applied to the transducer 21, (*c*) is a rectified waveform of (*b*), (*d*) is an output waveform of the band pass filter 28, (*e*) is an output waveform of the phase selection circuit 29, and (*f*) is an output waveform of the low pass filter 30 and is applied to the analog adder 23 as a feed-back signal. FIG. 11A (*a*) through (*f*) shows waveforms for providing positive feed-back signals, and FIG. 11 (*a*) through (*f*) shows waveforms for providing negative feed-back signals.

Assuming that the output frequency of the voltage controlled oscillator 24 drops below the resonant frequency $f_o$ of the transducer 21, due to a change of temperature etc., the output current of the transducer 21, as detected by the current detector 26, would decline as shown in the portion $L_1$ in the curve of FIG. 9. Under these conditions, the higher the driving frequency, the larger the output current. Since according to the waveform in FIG. 11A(*a*) the driving frequency due to modulated wave oscillator 22 deviates slightly the driving frequency during $t_1$ (in FIG. 11A) when the output of the modulated wave oscillator 22 is positive may be a little high, and the driving frequency during $t_2$ when the output of the modulated wave oscillator 22 is negative may be a little low. Accordingly, the output current of transducer 21 is shown in FIG. 11A(*b*), wherein the amplitude during $t_1$ is high and the amplitude during $t_2$ is low. The rectifier 27 corrects the waveform in FIG. 11A(*b*) and provides the output shown in FIG. 11A(*c* ), which is applied to the band pass filter 28. The output waveform of band pass filter 28 is shown in FIG. 11A(*d*). The phase selection circuit 29 picks up the positive half cycle of the waveform in FIG. 11(*d*) according to the waveform in FIG. 11(*a*), and provides the output waveform shown in FIG. 11(*e*) which is applied to the low pass filter 30. The low pass filter 30 provides the positive voltage shown in FIG. 11A(*f*). The amplitude of the positive voltage corresponds to the amplitude of the waveform in FIG. 11(*e*). Said positive voltage in FIG. 11A(*f*) is applied to the analog adder 23, which, in this case, increases the input voltage of voltage controlled oscillator 24. The output frequency of the voltage controlled oscillator 24 is therefore, increased, and the driving frequency of the transducer reaches resonant frequency $f_o$, in which the most powerful ultrasonic wave is radiated.

On the contrary, when the output frequency of voltage controlled oscillator 24 becomes higher than the resonant frequency $f_o$ because of the temperature changes etc., the output current of the transducer 21, as detected by the current detector 26, is reduced as shown in the portion $L_2$ in the curve of FIG. 9. Under these conditions, the higher the driving frequency the lower the output current. Accordingly, the waveform of the output of the current detector 26 is shown in FIG. 11B(*b*). That is to say, the output of the current detector 26 is low during $t_1$, and the output of the current detector 26 is high during $t_2$. In this case, the outputs of the rectifier 27, the band pass filter 28, the phase selection circuit 29 and the low pass filter 30 are shown in FIGS. 11B(*c*), 11B(*d*), 11B(*e*) and 11B(*f*) respectively. And the negative voltage shown in FIG. 11B(*f*) is applied to the analog adder 23, which reduces the input voltage of the voltage controlled oscillator 24. Thus the output frequency of the voltage controlled oscillator 24, and the driving frequency are reduced to resonant frequency $f_o$.

As was mentioned above, according to the second embodiment of the present invention, the transducer is always driven at resonant frequency $f_o$. The transducer in the present invention is not necessarily limited to a ceramic type piezo electric transducer, and any ultrasonic transducer can be utilized.

From the foregoing it will now be apparent that a new and improved ultrasonic wave generator has been found. It should be understood, of course, that the embodiments disclosed are merely illustrative and are not intended to limit the scope of the invention. Reference should be made to the appended claims, therefore, rather than the specifications for indicating the scope of the invention.

What is claimed is:

1. An ultrasonic wave generator comprising at least a transducer for generating an ultrasonic wave having at least a driving electrode and a detection electrode, a variable frequency oscillator whose output signal is applied to said driving electrode, and a slope detection circuit which detects the amplitude of the output signal of said detection electrode and controls the output frequency of said variable frequency oscillator for obtaining the maximum amplitude of output signal in said detection electrode.

2. An ultrasonic wave generator according to claim 1, further comprising a binary counter connected between said slope detection circuit and said variable frequency oscillator, the status of said binary counter being changed when the output amplitude of said detection electrode is reduced, and said binary counter controlling the output frequency of said variable frequency oscillator through an integral circuit.

3. An ultrasonic wave generator according to claim 2, further comprising an oscillator whose output is connected to the input of said binary counter through an OR circuit.

4. An ultrasonic wave generator comprising at least a transducer for generating an ultrasonic wave; a voltage controlled oscillator whose output is connected to said transducer through an amplifier; a detection means having a series circuit of a current detector for detecting the driving current of said transducer, a rectifier for adjusting the output signal of said current detector and a band pass filter connected to the output of said rectifier; an analog adder whose output is connected to the input of said voltage controlled oscillator; a modulation wave oscillator connected to one input of said analog adder; a phase selection circuit which picks up the output of said detection means according to the output amplitude of said modulated wave oscillator; and a low pass filter, the input of which is connected to the output of said phase selection circuit, the output of said low pass filter being connected to the other input of said analog adder.

* * * * *